United States Patent

Hatada

Patent Number: 5,625,527
Date of Patent: Apr. 29, 1997

[54] METALLIZED FILMS AND CAPACITORS CONTAINING THE SAME

[75] Inventor: Kenji Hatada, Kuritagun Shiga, Japan

[73] Assignee: Toray Industries, Inc., Japan

[21] Appl. No.: 421,756

[22] Filed: Apr. 14, 1995

[30] Foreign Application Priority Data

Apr. 15, 1994 [JP] Japan .................. 6-077297

[51] Int. Cl.$^6$ .................. H01G 4/14; C23C 14/20
[52] U.S. Cl. .................. 361/273; 361/304
[58] Field of Search .................. 361/273, 303–305, 361/301, 302, 306–313

[56] References Cited

U.S. PATENT DOCUMENTS

| | | | |
|---|---|---|---|
| 4,477,858 | 10/1984 | Steiner | 361/273 |
| 4,785,374 | 11/1988 | Nagai et al. | 361/305 |
| 5,518,823 | 5/1996 | Fujihira et al. | 428/610 |

FOREIGN PATENT DOCUMENTS

| | | | |
|---|---|---|---|
| 219896A5 | 3/1985 | Germany | H01G 4/14 |
| 4223568 | 11/1993 | Germany | C23C 14/20 |
| 882179 | 11/1961 | United Kingdom . | |

Primary Examiner—Leo P. Picard
Assistant Examiner—Phuong T. Vu
Attorney, Agent, or Firm—Austin R. Miller

[57] ABSTRACT

A metallized film suited for constituting a capacitor is disclosed. The metallized film according to the present invention includes a polymer base film and a vapor-deposited layer consisting essentially of Al and Zn, which is formed on the polymer base film. The Al content in the vapor-deposited layer is continuously varied along the direction of thickness thereof such that the Al content satisfies the equation of:

$$a_2 < a_3 < a_1$$

wherein $a_1$ represents Al content in terms of percent by weight based on the total weight of Al and Zn in the interface of the vapor-deposited layer and the polymer base layer; $a_2$ represents Al content in terms of percent by weight based on the total weight of Al and Zn at the center in the direction of thickness of the vapor-deposited layer; and $a_3$ represents Al content in terms of percent by weight based on the total weight of Al and Zn in the outer surface of the vapor-deposited layer.

10 Claims, 2 Drawing Sheets

1

METALLIZED FILMS AND CAPACITORS CONTAINING THE SAME

BACKGROUND OF THE INVENTION

I. Field of the Invention

The present invention relates to a metallized film and a capacitor comprising the same.

II. Description of the Related Art

Capacitors using polymer films have been widely used because of their ability to withstand high voltages as well as good temperature and frequency characteristics. Especially, metallized films having vapor-deposited metal layer as electrodes are favorably utilized because of their desirable property called "self-healing".

As a metal for forming the vapor-deposited layer, aluminum (Al) has been commonly selected since it has good corrosion resistance. However, in capacitors operated with alternate current under high voltage, corona discharge generated inside the capacitor makes the Al be oxidized and non-conductive. Consequently, a phenomenon called "$\Delta C$ effect" occurs, which means a decrease in the capacity C of the capacitor. In order to prevent $\Delta C$ effect caused by corona discharge, zinc (Zn) is often used for metallization. Zinc, however, has a problem of corrosion.

To solve these problems, countermeasures have been proposed in Japanese Patent Publication (Kokoku) No. 63-15737 and U.S. Pat. No. 4,477,858.

Japanese Patent Publication (Kokoku) No. 63-15737 discloses the prevention of oxidation of a vapor-deposited Zn layer by forming an oil layer on the clean surface of the Zn layer immediately after metallization, by means of vapor deposition inside the vacuum metallization chamber, so that water does not make direct contact with the surface of the vapor-deposited Zn layer, thereby preventing corrosion of the deposited Zn layer. However, even with this method, the vapor-deposited Zn layer of the capacitor tends to be hydroxidized when used in a high moisture environment, which induces an increase of tan$\delta$ or a deterioration of self-healing capability. This in turn causes capacitor breakdown due to a phenomenon called "thermal runaway". Especially, in the case where capacitor film is wound about a soft core and packaged simply with wax or pitch, moisture can get into the capacitor fairly easily, and tends to present the above mentioned problems.

In order to improve corrosion resistance of Zn, U.S. Pat No. 4,477,858 proposes a method where Al is vapor-deposited simultaneously with Zn. By letting the Al content reduce continuously along its thickness from polymer film surface side to the metal layer surface side as shown in FIG. 2, improvements in both moisture resistance and $\Delta C$ effect of the capacitors are said to be attained. However, although an improvement in moisture resistance is recognized, $\Delta C$ effect due to corona discharge was larger in such capacitors than the ones fabricated form films metallized with Zn alone.

SUMMARY OF THE INVENTION

Accordingly, an object of the present invention is to provide a metallized film suited for capacitors, with which the $\Delta C$ effect may be prevented, as well as the prevention of an increase in tan$\delta$ caused by corrosion and thermal runaway due to deterioration of self-healing may be prevented, which has stable characteristics even under high moisture. It is also an object of the present invention to provide a capacitor employing the metallized film according to the present invention.

The present inventor intensively studied to find that the above-mentioned objects may be attained by forming the vapor-deposited layer with Al and Zn, in which the Al content is continuously varied in a prescribed manner, thereby completing the present invention.

That is, the present invention provides a metallized film comprising a polymer base film and a vapor-deposited layer consisting essentially of Al and Zn, which is formed on said polymer base film, wherein Al content in said vapor-deposited layer is continuously varied along the direction of thickness thereof such that the Al content satisfies the equation of:

$$a_2 < a_3 < a_1$$

(wherein $a_1$ represents Al content in terms of percent by weight based on the total weight of Al and Zn in the interface between said vapor-deposited layer and said polymer base layer; $a_2$ represents Al content in terms of percent by weight based on the total weight of Al and Zn at the center between said interface and the surface of said vapor-deposited layer; and $a_3$ represents Al content in terms of percent by weight based on the total weight of Al and Zn in the surface of said vapor-deposited layer).

The present invention also provides a capacitor comprising the metallized film according to the present invention.

By the present invention, a metallized film suited for producing capacitors is provided, which is free from corrosion of the vapor-deposited layer and avoids any decrease in the capacity of the capacitor due to corona discharge, as well as free from failure due to thermal runaway. A capacitor employing the metallized film and thus having the above-mentioned advantageous effects is also provided.

DETAILED DESCRIPTION OF THE PREFERRED EMBODIMENTS

As mentioned above, the metallized film according to the present invention comprises a polymer base film. The polymer base film may be made of natural, semisynthetic or synthetic polymers. Among these, synthetic polymers are preferred in view of heat resistance, mechanical properties, electric properties and physicochemical properties. Preferred examples of the synthetic polymers include polyolefin resins, polyester resins, polyamide resins, polyimide resins, polyamideimide resins, polycarbonate resins, polysulfone resins, polyphenylene resins, polyallylate resins, fluorine-contained resins, polystyrene resins and polyallylene resins. Especially, polypropylenes, polyethylene naphthalates, polyethylene terephthalates, polyphenylenesulfides, polycarbonates and polystyrenes are preferred in view of mechanical properties and electric properties. The above-mentioned polymers may be employed individually or in combination.

The thickness of the polymer base film is not restricted and may usually be 0.6 to 50 µm, preferably 2 to 25 µm.

The vapor-deposited metal layer consisting essentially of Al and Zn may be formed by vacuum vapor deposition. The vacuum vapor deposition may be carried out by employing a resistance heating method, induction heating method, indirect heating method, electron beam method or sputtering method. Among these, a resistance heating method, induction heating method and indirect heating method are preferred in view of production efficiency.

An important feature of the metallized film according to the present invention is that the Al content in the vapor-deposited metal layer continuously varies along the direction of thickness thereof such that it satisfies the equation of:

$$a_2 < a_3 < a_1$$

Figure 1:
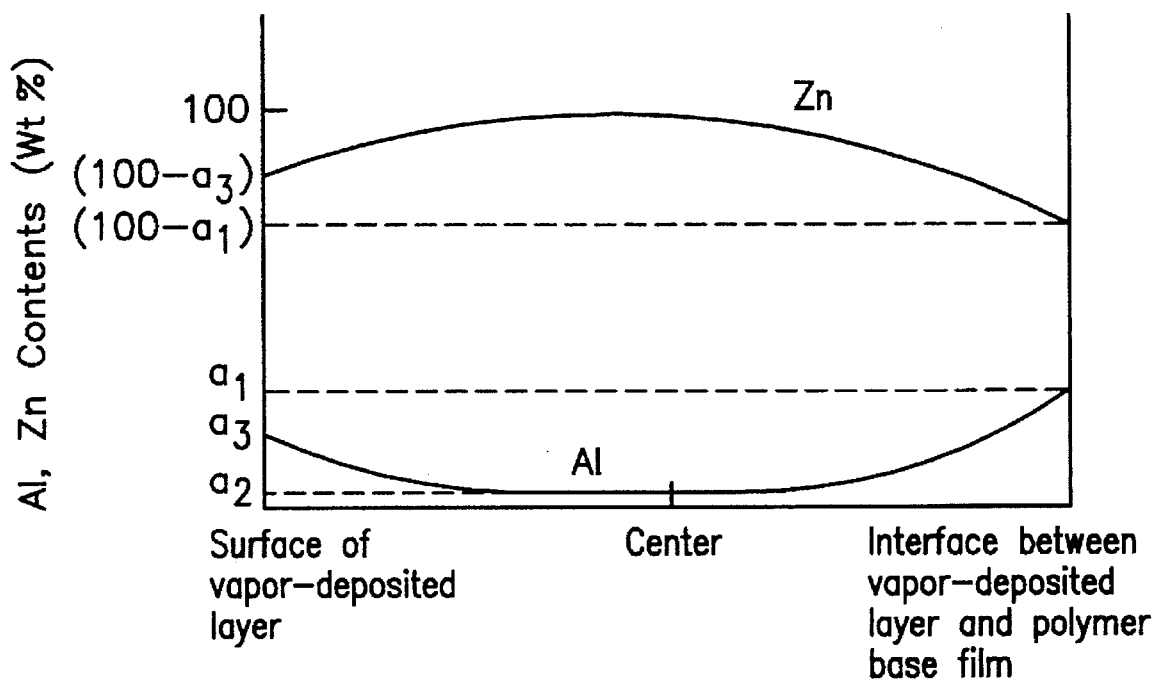
FIG. 1 shows an example of a profile of Al content in the vapor-deposited metal layer of the metallized film according to the present invention.
Figure 2:
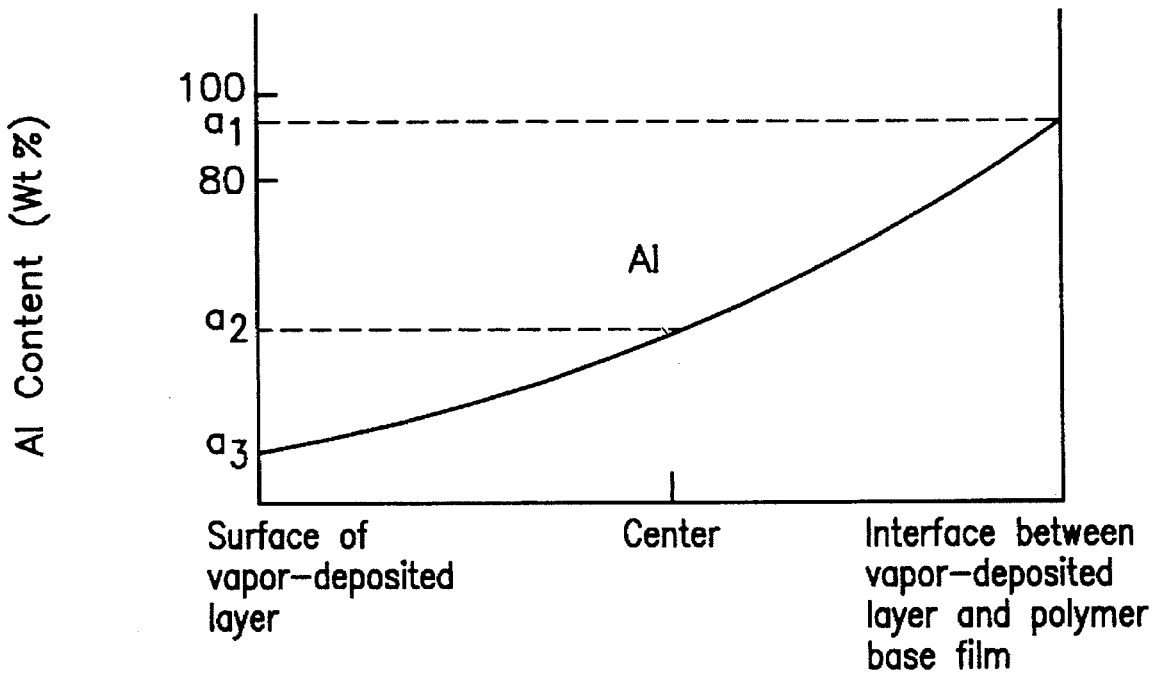
FIG. 2 shows the profile of Al content in the vapor-deposited metal layer of a known metallized film.

Here, $a_1$ represents Al content in terms of percent by weight based on the total weight of Al and Zn in the interface (i.e., the surface of the vapor-deposited layer, which surface contacts the polymer base film) between the polymer base film and the vapor-deposited layer; $a_2$ represents Al content in terms of percent by weight based on the total weight of Al and Zn at the center between the interface and the surface of said vapor-deposited layer opposite to the interfare and $a_3$ represents Al content in terms of percent by weight based on the total weight of Al and Zn in the surface of the vapor-deposited layer opposite to the interface. Thus, the Al content in the metal layer of the metallized film according to the present invention is such, for example, as shown in FIG. 1. This is in contrast with FIG. 2 showing the Al content profile in the metal layer of a known metallized film (U.S. Pat. No. 4,477,858). By virtue of the specific Al profile in the direction of thickness of the metal layer, the moisture resistance was greatly improved and the problem of $\Delta C$ effect was largely reduced.

To further promote the advantageous effects of the present invention, it is preferred that total Al content in terms of percent by weight in the entire vapor-deposited layer be not more than 10% by weight based on the total weight of Al and Zn in the entire vapor-deposited layer. The advantageous effects of the present invention are even further promoted when the total Al content in terms of percent by weight in the entire vapor-deposited layer be not more than 5% by weight based on the total weight of Al and Zn in the entire vapor-deposited layer, and $a_1$, $a_2$ and $a_3$ are within the following ranges:

$$a_1 \geq 60 \text{ wt \%}, 0 < a_2 \leq 2.0 \text{ wt \%}, 0.5 \leq a_3 \leq 10 \text{ wt \%}.$$

The vapor-deposited metal layer may contain one or more metals in addition to Al and Zn, such as Cu, Si, Mg, Mn, Cr, Pb, Sn, Fe, Cd and the like, in an amount not adversely affecting the performance of the capacitor. Although some of these metals, such as Si, promote moisture resistance, since the corrosion resistance is usually reduced by these metals, it is preferred that the amount of these metals be as small as possible. Thus, the total content of these metals is preferably not more than 1% by weight, more preferably not more than 0.1% by weight.

The thickness of the vapor-deposited metal layer is not restricted and may usually be 0.005 to 0.5 µm, preferably 0.007 to 0.05 µm.

An organic layer may be formed on the vapor-deposited metal layer. By forming the organic layer, moisture resistance may be further promoted.

The organic material constituting the organic layer may preferably be an organic substance having a low solubility in water. Especially, lipophilic low molecular substances or oils are preferred. Examples of the preferred organic materials constituting the organic layer include silicone oils, fluorine-contained oils, polyalkylnaphthalene oils, polyalkylphthalate oils, polyphenylether oils, petroleum fractions, mineral oils, microcrystalline waxes, polyolefin waxes, paraffin waxes and the like. In view of the promotion of moisture resistance, especially preferred are dimethylpolysiloxane oils and methylphenylpolysiloxane oils, as well as modified silicones, fluorinated silicone oils and perfluoroolefin oils, which have hydrodiene groups, hydroxyl groups, amino groups, epoxy groups, carboxyl groups and the like as reactive groups.

If the amount of the organic material constituting the organic layer is too small, promotion of the moisture resistance is not attained, while if it is too large, the surface of the film is sticky and reduction of adhesiveness is brought about. Therefore, the amount of the organic material should be appropriately selected. That is, although the thickness of the organic layer is not restricted, it may usually be 0.0005 to 0.05 µm, preferably 0.001 to 0.01 µm.

It is preferred to oxidize the surface of the vapor-deposited metal layer to form an oxidized layer, and to adsorb the organic material for constituting the organic layer to the oxidized layer. With this structure, the moisture resistance is largely improved, and the initiation voltage of the corona discharge is increased so that the $\Delta C$ effect is prominently reduced. The oxidation of the surface of the metal layer may be attained by treating the metal layer with oxygen plasma in the vacuum vapor deposition chamber. The thickness of the oxidized layer is not restricted and may usually be 0.001 to 0.01 µm, preferably 0.002 to 0.06 µm.

The process for producing the metallized film according to the present invention is not restricted. The metallized film according to the present invention may be prepared by vapor-depositing Al and then Zn and finally Al in the same vacuum vapor-deposition chamber, such that vapors of Al and Zn coexist.

Alternatively, the metallized film according to the present invention may be prepared as follows. That is, Al is first evaporated and immediately thereafter, Zn is evaporated in the same vacuum vapor-deposition chamber, such that vapors of Al and Zn coexist. By appropriately controlling the amounts of Al and Zn vapors, temperature of the cooling drum and running speed of the polymer base film, the cooling rate of the mixed metal of Al and Zn deposited on the surface of the polymer base film may be controlled, thereby a vapor-deposited layer of Al and Zn having the above-mentioned Al content profile may be formed. With this process, although the acceptable ranges of the above-mentioned parameters are narrow, this process is preferred for commercial production since this process may be accomplished by providing only two evaporation sources, that is, evaporation sources of Al and Zn, and controlling the evaporation from these only two sources.

This process will now be described in more detail referring to FIG. 3. In a vacuum vapor-deposition chamber 1, a polymer film is first unwound from an unwinding roll 2. The film is then introduced to a cooling drum 4 via a guiding roll 10. On the film, a margin portion is formed by coating an oil on the margin portion by an oil margin-forming apparatus 3. Aluminum is continuously evaporated from an Al evaporation source 5 and Zn is continuously evaporated from a Zn evaporation source 6. As required, the surface of the deposited Al-Zn layer is oxidized by an oxidation apparatus 7 employing low temperature plasma, thereby forming an oxidized layer in the surface of the vapor-deposited metal layer. An oil is then vapor-deposited on the surface of the oxidized layer by an oil evaporation apparatus 8 comprising an oil placed in a heating vessel. Thereafter, the film is wound about a winding roll 9 via guide rolls 10. The vacuum deposition chamber is divided to an upper chamber and a lower chamber by a partition 11. The oil vapor-deposited on the surface of the oxidized layer is adsorbed to the oxidized layer with time.

To obtain the distribution of Al defined in the present invention, it is important to appropriately control the distance between the Al evaporation source 5 and the Zn evaporation source 6, distance between each of these evaporation sources and the cooling drum 4, temperature of each of evaporation sources 5 and 6, temperature of the cooling drum 4, and running speed of the polymer base film. More particularly, in a preferred embodiment, the distance between the center of the Al evaporation source 5 and the center of the Zn evaporation source 6 is 150–250 mm, the distance between the surface of the Al evaporation source 5 and the point on the surface of the cooling drum 4, which point is on the line vertical to the surface of the Al evaporation source 5, is 150–250 mm, the distance between the surface of the nozzle of the Zn evaporation source 6 and the surface of the cooling drum 4 is 2–5 mm, the temperature of the cooling drum 4 is −25° to 0° C., and the film running speed is 500–800 m/min. These parameters may be adjusted while monitoring the amounts of evaporated Al and Zn by a surface resistance meter and an atomic light absorption meter, so as to attain the desired resistance (usually at the high resistance section of the deposited layer, the surface resistance is 6–40 Ω/□) and to attain the total Al content of 1–10% by weight, thereby attaining the desired amounts of the deposited Al and Zn. If the distance between the evaporation sources is less than 150 mm and if the distance between the Zn evaporation source 6 and the cooling drum 4 is more than 5 mm, $a_1$ is too small, and if the distance between the Zn evaporation sources is more than 250 mm, $a_1$ is too large.

It should be noted that the above-mentioned process is merely one embodiment, and the process for producing the metallized film is not restricted to the process mentioned above.

The contents of Al and Zn and the distribution thereof in the vapor-deposited layer may be determined by the following method. That is, firstly, a portion of the vapor-deposited layer is dissolved by hydrochloric acid and contents of Al and Zn are determined by inductively coupled plasma spectrometry method (ICP). Then the metallized film is mounted in an Auger electron spectroscopy apparatus and the atomic composition of the deposited metal layer is determined while sputter etching the deposited metal layer. By normalizing the atomic composition data thus obtained with the Al and Zn content data obtained by ICP, a composition distribution diagram such as shown in FIG. 1 can be obtained. The values of $a_1$, $a_2$ and $a_3$, as well as the total content of Al can also be determined.

In the present invention, the term "interface between the vapor-deposited layer and the polymer base film" is defined as the point where the Auger peak value arising from the carbon atom C of the polymer film is equal to ½ of its saturated value, and the term "the center between the interface and the surface of the vapor-deposited layer" is defined as the half way point between the interface thus defined and the surface of the vapor-deposited layer.

The present invention also provides a capacitor comprising the above-described metallized film according to the present invention. The capacitor may have the same structure as the conventional film capacitors except that the metallized film employed is the metallized film according to the present invention. That is, in case of a wound type capacitor, a pair of metallized films (usually obtained by slitting the metallized film into tapes having narrower widths) which have margin portions at the opposite sides are laminated and the laminate is wound about a core. A metal called metallicon is sprayed to both side surfaces of the obtained roll. In case of a laminate type capacitor, metallized films which have margin portions at the opposite sides are alternately laminated. A metal called metallicon is sprayed to both side surfaces of the obtained laminate. Electric terminals are then connected to the metallicon. The obtained structure may then be enclosed in a casing.

Methods for determining physical values will now be described.

(1) Quantitative Determination of Al and Zn

A sample of 9 cm$^2$ was dissolved with diluted nitric acid and 20 ml of the solution was measured. Quantitative determination of Al and Zn was performed by analyzing the solution with inductively coupled plasma spectroscopy (ICP). The ICP apparatus used was SPS1200VR type commercially available from SEIKO ELECTRONIC INDUSTRY.

(2) Composition Distribution of Al and Zn

Al and Zn composition distribution was quantitatively analyzed by Auger electron spectroscopy, using an apparatus JAMP-10S type commercially available from JEOL, while etching the vapor-deposited layer from the top surface thereof by Ar ion.

Conditions of Ar ion etching:

Acceleration voltage: 3 kV

Sample current: $1 \times 10^{-6}$ A

Etching rate: 19 nm/min in terms of SiO$_2$

Measuring conditions:

Acceleration voltage: 3 kV

Slit No.: 5

Sample Current: $8 \times 10^{-8}$ A

Tilt angle of sample: 72°

Beam diameter: 10 μm (3) Electrostatic Capacity (C).

Electrostatic capacity was measured by Schering bridge, using AUTOMATIC SCHERING BRIDGE type DAC-PSC-20W, commercially available from SOKEN DENKI, under measuring conditions of 60 Hz and 400 V.

The present invention will now be described in more detail by way of examples thereof. It should be noted, however, that the examples are presented for the illustration purpose only and should not be interpreted in any restrictive way.

EXAMPLE 1, COMPARATIVE EXAMPLES 1 AND 2

Figure 3:
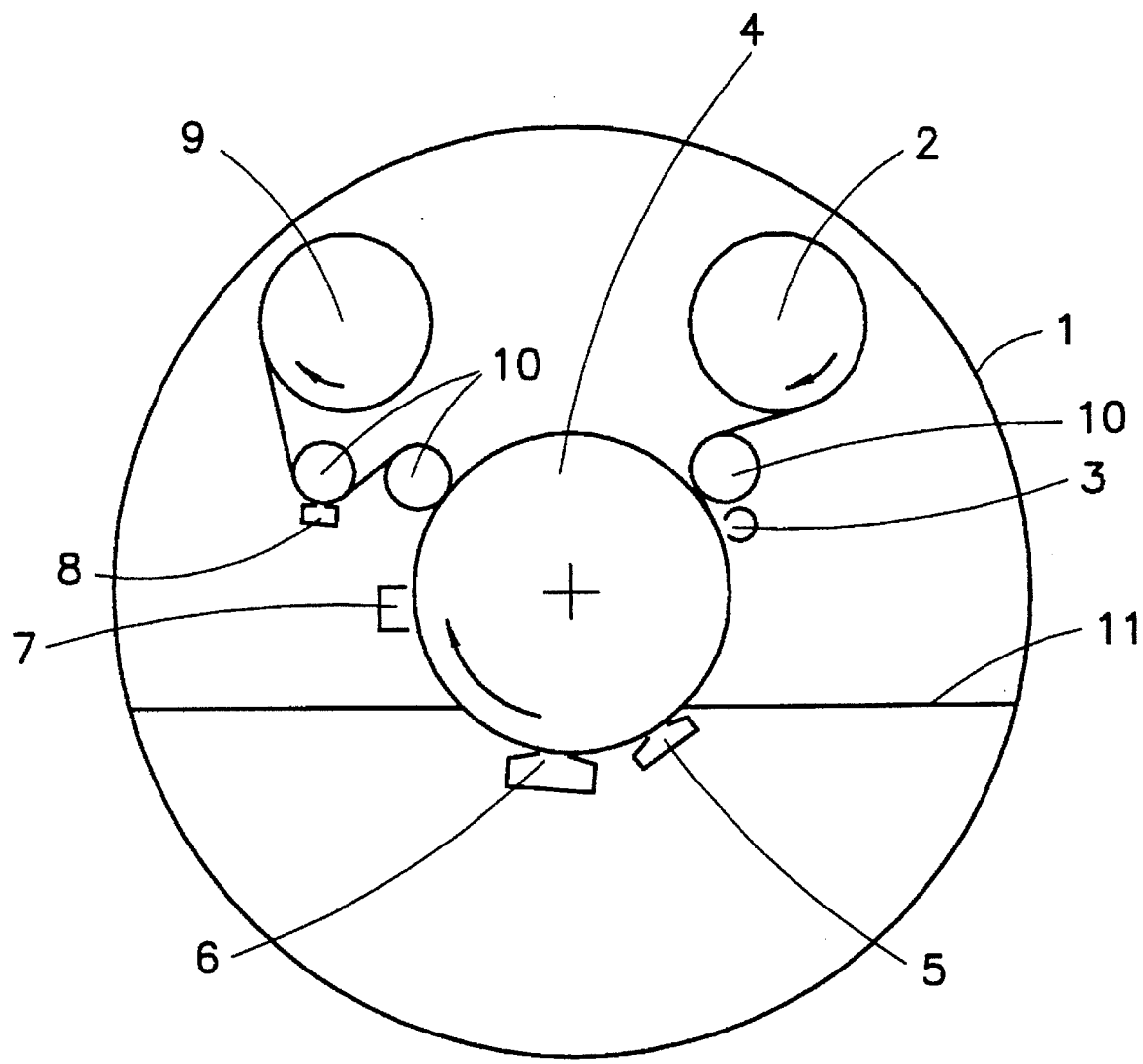
FIG. 3 schematically shows an apparatus for producing the metallized film according to the present invention.

Using the apparatus shown in FIG. 3, a polypropylene film having a thickness of 7 μm was metallized with Al and Zn. The distance between the evaporation sources was 218 mm, the distance between the surface of the Al evaporation source 5 and the point on the surface of the cooling drum 4, which point is on the line vertical to the surface of the Al evaporation source 5, was 194 mm, the distance between the uppermost surface of the evaporation nozzle of the Zn evaporation source 6 and the cooling drum 4 was 4 mm, the temperature of the cooling drum was −22° C. and the film running speed was 712 m/min. In the deposited Al-Zn film, $a_1$ was 36% by weight, $a_2$ was 0.1% by weight and $a_3$ was 2.0% by weight, and the total content of Al was 2.4% by weight (Example 1). For comparison, on the polypropylene film mentioned above, Zn alone was vapor-deposited using Ag as a nuclear. Further, for comparison, the polypropylene film mentioned above was metallized with Al and Zn in a conventional manner such that $a_1$ was 80% by weight, $a_2$ was 6% by weight and $a_3$ was 5% by weight, and the total Al content was 10% by weight.

For the resistance measurements of the metallized layer, 3 mm heavy edge was made at the outlet side of the electrode whose resistance was made to be 2.5 $\Omega/\square$. The resistance of active area was made to be 8 $\Omega/\square$.

These metallized films were aged for one day after metallization, and slit to narrow reels having 50 mm width with margin width of 2.5 mm.

These narrow reels were then rewound about soft cores, put schooping, heat treated, and let electrode terminals attached. These were immersed into wax, packaged with pitch to produce capacitors having a capacity of 5 µF.

Ten such capacitors from each example were subjected to 375 V AC and kept in a constant temperature and moisture chamber at 40° C., 95% RH for 1000 hours. Capacities of these samples were subjected to measurement with Schering bridge to determine the changes in capacities ($\Delta C$), occurred during this test. The results are shown in Table 1.

TABLE 1

|  | $\Delta C/C$ (%) | Number of capacitors broke down during test |
| --- | --- | --- |
| Example 1 | −2.75 | 0/10 |
| Comparative Example 1 | −9.65 | 6/10 |
| Comparative Example 2 | −19.45 | 0/10 |

$$\Delta C/C(\%) = \frac{\text{(capacity after test)} - \text{(capacity before test)}}{\text{(capacity before test)}} \times 100$$

As shown in Table 1, with the capacitors according to the present invention, the changes in the capacities were small and no capacitors were broken during the test.

EXAMPLE 2, COMPARATIVE EXAMPLE 3

The same operation as in Example 1 was repeated except for aluminum evaporation rate and that the surface of the vapor-deposited metal layer was oxidized by treatment with oxygen plasma whose primary electric input was 1 kW, followed by vapor-depositing methylphenylsiloxane (trademark SH702, commercially available from TORAY DOW CORNING SILICONE CO.) on the oxidized layer in the vapor-deposited metal layer in the same vapor-deposition chamber, the methylphenylsiloxane being evaporated from a vessel heated at 170° C. (Example 2).

For comparison, on the polypropylene film having the same thickness as mentioned above, Zn alone was vapor-deposited using Cu as a nuclear (Comparative Example 3). On the vapor-deposited metal layer methylphenylsiloxane was vapor-deposited in the same vapor-deposition chamber as in Example 2. The specification of the resistances of these films were made to be the same as that in Example 1.

These metallized films were slit in the same manner as in Example 1. Capacitors were prepared therefrom and performances thereof were tested in the same manner as in Example 1. The results are shown in Table 2.

TABLE 2

|  | $\Delta C/C$ (%) | Number of capacitors broke down during test |
| --- | --- | --- |
| Example 2 | −1.25 | 0/10 |
| Comparative Example 3 | −6.95 | 4/10 |

$$\Delta C/C(\%) = \frac{\text{(capacity after test)} - \text{(capacity before test)}}{\text{(capacity before test)}} \times 100$$

As can be seen from Table 2, the capacitors according to the present invention exhibited excellent properties.

EXAMPLES 3, 4 AND 5, COMPARATIVE EXAMPLES 4 AND 5

In the similar manner as in Example 1, a polypropylene film having a thickness of 7 µm was metallized with Al and Zn such that Al contents attain the values shown in Table 3. The specification of the resistances of these films were made to be the same as that in Example 1. In Examples 3, 4 and 5, poly(dimethylsiloxane) (trademark SH200, 10CS, commercially available from TORAY DOW CORNING SILICONE CO.) was vapor-deposited on the surface of the vapor-deposited metal layer in the same vacuum vapor-deposition chamber by evaporating it from a vessel heated at 100° C. In Comparative Example 5, Al was first vapor-deposited, and then Zn was vapor-deposited and then Al was vapor-deposited again.

Using the thus obtained films, capacitors were prepared and tested in the same manner as in Example 1. The results are shown in Table 3.

As shown in Table 3, the capacitors according to the present invention, especially those having a total Al content of not more than 5% by weight, exhibited excellent properties.

TABLE 3

|  | Al distribution and total Al content (weight %) | | | | Test Results | |
| --- | --- | --- | --- | --- | --- | --- |
|  | $a_1$ | $a_2$ | $a_3$ | total Al content | $\Delta C/C$ (%) | Number of capacitors broke down during test |
| Example 3 | 30 | not more than 0.1 | 1.5 | 0.15 | −1.56 | 0/10 |
| Example 4 | 65 | 0.6 | 6.0 | 4.5 | −1.84 | 0/10 |
| Example 5 | 78 | 2.1 | 10 | 9.5 | −3.21 | 0/10 |
| Comparative Example 4 | 76 | 4 | 4 | 5.6 | −10.31 | 0/10 |
| Comparative Example 5 | 85 | 2.8 | 100 | 25 | −34.52 | 0/10 |

We claim:

1. A metallized film capable of being used in a capacitor comprising a polymer base film and a vapor-deposited layer consisting essentially of Al and Zn, said vapor-deposited layer being formed on said polymer base film to define an interface consisting of a first surface contacting said polymer base film, said vapor-deposited layer also having a second surface opposite to said interface, wherein Al content in said vapor-deposited layer is continuously varied along the direction of thickness thereof such that the Al content satisfies the equation of:

$$a_2 < a_3 < a_1$$

wherein $a_1$ represents Al content in terms of percent by weight based on the total weight of Al and Zn in said interface;

$a_2$ represents Al content in terms of percent by weight based on the total weight of Al and Zn at the center between said interface and said second surface of said vapor-deposited layer; and $a_3$ represents Al content in terms of percent by weight based on the total weight of Al and Zn in said second surface of said vapor-deposited layer.

2. The metallized film according to claim 1, wherein total Al content in terms of percent by weight in the entire vapor-deposited layer is not more than 10% by weight based on the total weight of Al and Zn in the entire vapor-deposited layer.

3. The metallized film according to claim 2, wherein $a_1 \leq 60\%$ by weight, $0 < a_2 \leq 2.0\%$ by weight, $0.5 \leq a_3 \leq 10\%$ by weight, and total Al content in terms of percent by weight in said vapor-deposited layer is not more than 5% by weight based on the total weight of Al and Zn in the entire vapor-deposited layer.

4. The metallized film according to claim 1, further comprising an organic layer formed on said vapor-deposited layer.

5. The metallized film according to claim 2, further comprising an organic layer formed on said vapor-deposited layer.

6. The metallized film according to claim 3, further comprising an organic layer formed on said vapor-deposited layer.

7. The metallized film according to claim 4, wherein the surface of said vapor-deposited layer is oxidized to form an oxidized layer and the organic material constituting said organic layer is adsorbed on said oxidized layer.

8. The metallized film according to claim 5, wherein the surface of said vapor-deposited layer is oxidized to form an oxidized layer and the organic material constituting said organic layer is adsorbed on said oxidized layer.

9. The metallized film according to claim 6, wherein the surface of said vapor-deposited layer is oxidized to form an oxidized layer and the organic material constituting said organic layer is adsorbed on said oxidized layer.

10. A capacitor comprising said metallized film according to any one of claims 1–9.

* * * * *